United States Patent [19]
Nelle et al.

[11] Patent Number: 5,456,021
[45] Date of Patent: Oct. 10, 1995

[54] APPARATUS AND METHOD FOR MEASURING LINEAR AND ANGULAR DISPLACEMENTS

[75] Inventors: Gunther Nelle, Bergen; Siebert Holstein, Stein/Traun, both of Germany

[73] Assignee: Johannes Heidenhain GmbH, Traunreut, Germany

[21] Appl. No.: 117,255

[22] Filed: Sep. 3, 1993

[30] Foreign Application Priority Data

Sep. 4, 1992 [DE] Germany .................. 42 29 575.0

[51] Int. Cl.⁶ ..................................... G01B 11/00
[52] U.S. Cl. .................. 33/707; 33/706; 250/237.G; 356/374
[58] Field of Search ............... 33/706, 707; 356/374; 250/237 G

[56] References Cited

U.S. PATENT DOCUMENTS

| | | |
|---|---|---|
| 4,225,931 | 9/1980 | Schwefel . |
| 4,580,046 | 4/1986 | Sasaki et al. . |
| 4,602,436 | 7/1986 | Ernst .................... 33/707 |
| 4,778,273 | 10/1988 | Michel ................... 356/374 |

FOREIGN PATENT DOCUMENTS

| | | |
|---|---|---|
| A3000378 | 10/1980 | European Pat. Off. . |
| A0076861 | 10/1982 | European Pat. Off. . |
| 30 00 378 | 3/1979 | Germany . |
| 3243759 | 5/1984 | Germany . |
| 3612609 | 10/1987 | Germany ............ 33/706 |
| WO89/11080 | 11/1989 | Germany . |
| 4125865 | 2/1993 | Germany ............ 356/138 |

*Primary Examiner*—Alvin Wirthlin
*Attorney, Agent, or Firm*—Willian Brinks Hofer Gilson & Lione

[57] ABSTRACT

An apparatus and method for measuring displacement by determining the relative speed between a scale and a scanning plate from reading out a first track twice at different times. From this, correction values for the other tracks are calculated, which represent values from those tracks that would have been read out if all those tracks had been read out at the same time the first track was read out instead of sequentially.

8 Claims, 2 Drawing Sheets

APPARATUS AND METHOD FOR MEASURING LINEAR AND ANGULAR DISPLACEMENTS

FIELD OF THE INVENTION

The present invention relates to an apparatus and method for measuring linear and angular displacements, and, more particularly, to an apparatus and method for dynamically determining absolute position using a multiple track incremental measuring instrument.

BACKGROUND OF THE INVENTION

Displacement measuring instruments are used for measuring the relative location of one object with reference to another. A particular application of such displacement measuring instruments can be found in machining equipment for measuring the relative location of a machine tool with respect to the bed of the machine tool. Another application can be found in coordinate measuring machines to ascertain the location and dimensions of test specimens for example.

Two categories of displacement measuring instruments are referred to as absolute and incremental. Absolute measuring systems provide a code value which represents the absolute position of a slide or a machine member directly. Discriminable codes are provided on a coding member such as a scale and a predetermined absolute origin acts as the reference so that a position can be determined solely by reading the particular code.

Incremental measuring systems produce digital signals which increase or decrease the measured value by incremental steps. A scanning device scans the coding member to generate periodic scanning signals from which counting pulses for each individual graduation, or after electronic interpolation, for a fraction of a graduation, are obtained in an evaluation device. Counting these pulses in a counter furnishes an instantaneous position measurement value and is done in each case based on freely selectable measurement reference locations. These measurement reference locations may be assigned encoded reference marks whose locations are fixedly assigned to certain positions to distinguish among them.

PCT Publication No. WO 89/11080 published Nov. 16, 1989 describes an incremental type measuring instrument. In particular, in order to generate a position-coded signal at virtually any time in a position-measuring instrument, two tracks are scanned by means of two sensors, each of which produces a sinusoidal signal pair (cos $\alpha$; sin $\alpha$; cos $\beta$, sin $\beta$) or a similar periodic signal with a definite phase relation at any given time, the periods of the phases having a ratio of m/m–1. The desired relative distance is derived from the difference between the two phase relations.

SUMMARY OF THE INVENTION

It is an object of the present invention to provide a displacement measurement apparatus and method which can be operated for dynamic absolute position determination, in which incremental measuring signals in multiple-track measuring instruments are sequentially ascertained and corrected.

It is another object of the present invention to provide a displacement measurement apparatus and method for determining an absolutely encoded position for long measurement lengths and with high resolution using only a few incremental tracks the signals from which are suitable for interpolation, and the interpolation values of each track corrected with dynamic scanning. Expensive sample and hold elements for each track are thereby rendered unnecessary.

The invention itself, together with objects and attendant advantages, will be best understood by reference to the following detailed description taken in conjunction with accompanying drawings. It should be understood, however, that this description is intended to be illustrative rather than limiting, the scope of the invention being defined by the appended claims and equivalents thereof.

According to a first aspect of the invention, there is provided an apparatus for measuring displacement of a first object relative to a second object having a scale located on the first object and a scanning unit located on the second object. The scale has a plurality of tracks, each track having graduations. The scanning unit scans the plurality of tracks on the scale and a measured value for each track is sequentially read out beginning with a first track. The measured values after the first track are corrected so that the corrected measured values represent values that would have been read out from each of the tracks after the first track if those tracks had been read out at the same time the first track was read out.

According to another aspect of the invention, there is provided a method for measuring displacement of a first object movable relative to a second object by providing a scale located on the first object and a scanning plate located on the second object. The scale is provided with a plurality of tracks, each track having a graduation period different from the graduation period of each other track. The plurality of tracks of the scale beginning with a first track are sequentially scanned to ascertain measured values for each track. The first track is then rescanned to ascertain a second measured value for the first track. Correction values are then calculated for each track sequentially scanned after the first track. The correction values are determined by calculating the distance travelled between the scanning of the first track and the rescanning of the first track and the number of sequentially scanned tracks. The measured values for each track sequentially scanned after the first track are corrected by the calculated correction values. The corrected measured values represent values which would have been read from those tracks had they been scanned at the same time the first track was scanned. An absolute position value is calculated from the measured value of the first track and corrected measured values of the remaining tracks.

DESCRIPTION OF THE PREFERRED EMBODIMENT

The entire contents of German Application No. P42-29-575, filed Sep. 4, 1992 are hereby incorporated by reference.

Figure 1:
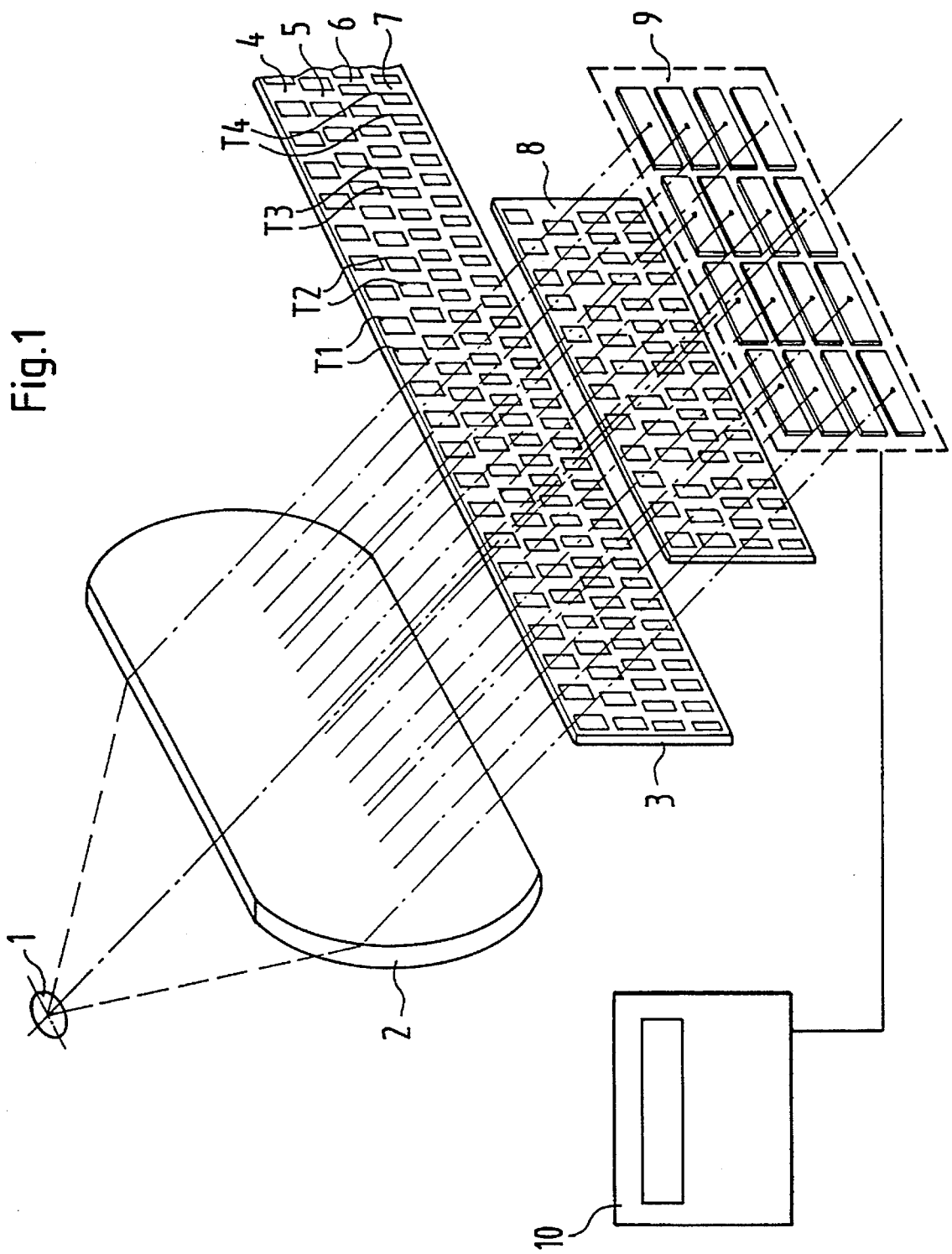
FIG. 1 illustrates a schematic of a displacement measuring system according to a first embodiment of the present invention.

FIG. 1 illustrates a schematic of a displacement measuring system according to a first embodiment of the present invention. The displacement measuring system includes a scale 3 and a scanning unit. The scanning unit includes a light source 1, a condenser 2, a scanning plate 8, a detector unit 9 and an evaluation unit 10. The measuring instrument can be used to measure the relative position and location of a machine tool (not shown) with respect to the bed of the machine tool (not shown). For such an application, the scanning unit would be mounted to the bed of the machine tool and the scale 3 would be mounted to a slide piece of the machine tool.

The scale 3 incorporates preferably four tracks 4, 5, 6, and 7 of graduations T1, T2, T3 and T4. Each track has a series of graduations. With reference to the first track 4, graduations T1 are equidistantly spaced from one another by gaps. The first track 4 thus has a constant graduation period, the graduation period defined as the distance from the beginning of one graduation T1 to the beginning of the next adjacent graduation T1. Because the preferred embodiment of the measuring system is illustrated as operating on the transmitted light principle, the graduations of the tracks may be formed by photopermeable strips and the gaps separating the graduations may be formed by photo-impermeable strips. The strips having a longitudinal extent oriented transversely to the measuring direction follow one another in alternation in the measuring direction as illustrated.

The graduations T2 of the second track 5 also have a constant graduation period which is different from the graduation period of the first track 4. The graduations T3 and T4 of the third and fourth tracks respectively, likewise have constant graduation periods, those periods being different from each other and from the periods of the first and second tracks. Thus each track of the scale 3 has a constant graduation period unique to that track.

While the scale 3 as illustrated would be used to measure linear displacements, the present invention can be embodied in an angular displacement system by locating the measuring tracks on a rotating disk, for example.

The scanning plate 8 and detector unit 9 have scanning and detection fields that are adapted and associated with the measuring tracks of the scale 3. The scanning plate 8 includes four rows of scanning fields, each row scanning a particular track of the scale 3 in a known manner. Each scanning field has a particular graduation period. The graduation period of each scanning field is offset from one another by one quarter of the graduation period of the track scanned by the row of scanning fields. As a result, in a known manner two sinusoidal signals, offset from one another by one-quarter graduation period, are generated in a known manner per track from each measuring track 4, 5, 6 and 7, and these signals are capable of interpolation in predetermined steps.

A suitable selection of the graduation periods to one another enables particularly simple and reliable decoding of the absolute position value to be ascertained. The mathematical relationships of the graduation periods should be selected suitably.

The light source 1 and condenser 2 are positioned to illuminate the scale 3 and the scanning plate 8 as is well known. The light flux generated by the illuminating arrangement which passes through the scale 3 and the scanning plate 8 fall upon respective photodetectors of the detector unit 9 and is modulated by the graduations during relative movement between the scale 3 and the scanning plate 8.

Figure 2:
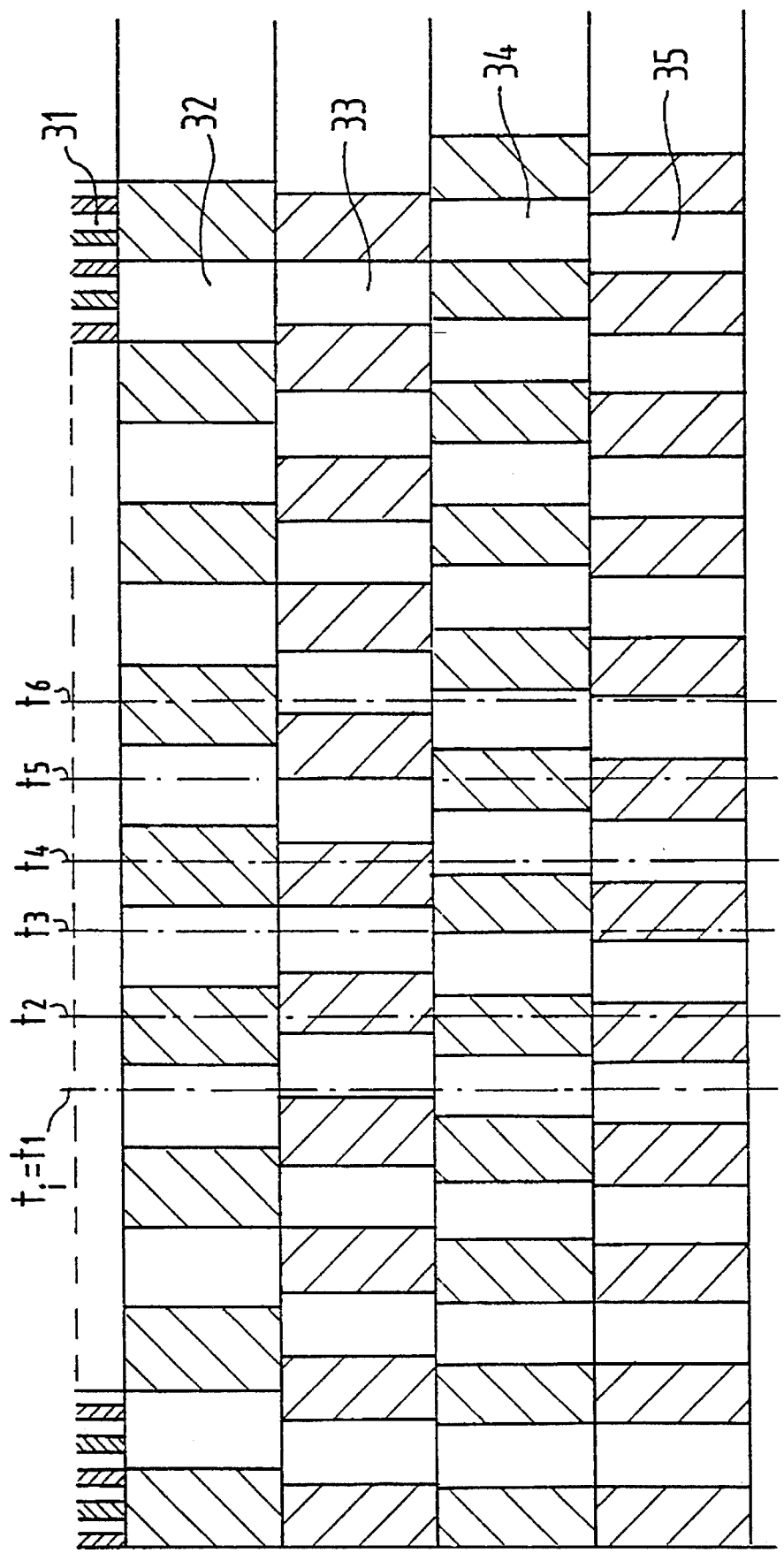
FIG. 2 illustrates a scale according to a second embodiment of the present invention.

FIG. 2 illustrates a scale 3 according to a second embodiment of the present invention. The graduations and graduation periods in the measuring tracks 31, 32, 33, 34 and 35 are designed according to the teachings described in German application P 41 25 865.7 which is hereby fully incorporated by reference. For purposes of illustration, however, the design has been exaggerated in FIG. 2.

To explain the principle of dynamic scanning according to the present invention, various readout lines $t_i$, i=1, ... n are shown in dot-dashed form. The spacing of the readout lines $t_i$ in the measuring direction results from the displacement speed of the relative motion between the scanning plate 8 and the scale 3. The read out lines $t_i$ serve to indicate the various readout times. The tracks are dynamically sequentially scanned by the scanning unit.

At the time of the first readout, the scanning plate 8 shown in FIG. 1 is located at the readout line $t_1$ in order to scan the first track 31. As a result of displacement between the scanning plate 8 and the scale 3, the scanning plate 8 when scanning the second track 32 is located at readout line $t_2$. When scanning the third track 33, the scanning plate 8 is located at readout line $t_3$ and so forth.

After the sequential scanning of all the tracks of scale 3, measured values are available for the various tracks 31, 32, 33, 34 and 35. These measured values differ by a displacement amount from the measured value of the first track read out at time $t_1$ because of the relative displacement of the scale and scanning plate 8 that occurs between the sequential readout times.

Once all the tracks have been scanned, the first track 31 is scanned additionally a second time, and a second measured value is generated for this track. This second measured value is created at a time in which the scanning plate 8 is located at the readout line $t_6$ and is balanced with the first measured value from the first scanning at $t_1$. More particularly, given an adequately uniform displacement speed, the distance travelled between $t_1$ and $t_6$ is determined. This distance travelled is then stored preferably digitally in memory.

Given an adequately uniform displacement speed, or in other words constant time intervals between the measurements in the various tracks 31, 32, 33, 34 and 35, a correction value for each measured value of the tracks after the first track or reference track is ascertained. Each correction value is ascertained from the distance travelled between the two measurements $t_1$ and $t_6$ of the first track 31 and from the relationships among the times of the measurements of the first track and the other tracks. Given known time differences between the readouts of the various tracks, the travel between these readouts and hence a correction value for the readouts can be ascertained directly, via the relative speed, from the time between the readouts of the reference track and the further tracks. From the measured values corrected in this way, an encoded value is calculated. The encoded position value represents the measured value of all the tracks as if each track had been simultaneously read at the same time the reference track was first read. Because of the dynamic nature of the scanning, expensive sample and hold elements are eliminated. By this provision, the measured values become independent of the time of actual readout because regardless of a relative motion between the scale 3 and the scanning plate 8, the same readout time—namely that at the readout line $t_1$—applies to all the tracks.

While this invention has been shown and described in connection with the preferred embodiments, it is apparent that certain changes and modifications, in addition to those mentioned above, may be made from the basic features of the present invention. Accordingly, it is the intention of the Applicants to protect all variations and modifications within the true spirit and valid scope of the present invention.

What is claimed is:

1. A method for reading a scale of a displacement measuring instrument, comprising the steps of:

reading sequentially each track of the scale that has a plurality of tracks at a uniform displacement speed by means of a scanning plate movable relative to the scale to generate measured values for each track;

digitally storing the measured values;

rescanning the first track scanned in the first step to generate a second measured value;

calculating a displacement from the time between when the first track was scanned and when the first track was rescanned;

calculating correction values for each track after the first track using the displacement calculated in the previous step and the number of sequentially read out tracks; and correcting the measure values of each track after the first track by the previously calculated correction values so that the corrected measure values represent what the values of each track after the first track would have been had they been read out at the same time as the first track.

2. A method for reading a scale of a displacement measuring instrument, comprising the steps of:

reading out measured values from a scale having a plurality of tracks with graduations of different graduation periods by means of a scanning plate, the scanning plate being movable relative to the scale, wherein the measured values of all of the tracks of the scale, beginning with a first track are read out one after the other at known time intervals;

storing the measured values in memory;

determining the speed of relative movement between the scale and the scanning plate;

after the speed of relative movement between the scale and the scanning plate is determined, correcting the measured values derived from the tracks after the first track so that the corrected measured values represent what would have been the measured value of each track after the first track if they had been readout at the same time as the first track; and calculating an absolute position code from the measured value of the first track and the corrected measured values from each track after the first track.

3. A method for measuring displacement of a first object movable relative to a second object comprising the steps of:

providing a scale located on the first object, the scale having a plurality of tracks, each track having a graduation period different from the graduation period of each other track;

providing a scanning plate located on the second object;

sequentially scanning the plurality of tracks of the scale beginning with a first track and continuing through a last track to ascertain measured values for each track;

rescanning the first track scanned in the previous step to ascertain a second measured value for the first track;

calculating correction values for each track sequentially scanned after the first track, the correction values determined by calculating the distance travelled between the scanning of the first track and the rescanning of the first track and the number of sequentially scanned tracks;

correcting the measured values for each track sequentially scanned after the first track by the calculated correction values wherein the corrected measured values represent values which would have been read from each track sequentially scanned after the first track had they been scanned at the same time the first track was first scanned; and calculating an absolute position value from the measured value of the first track and the corrected measured values of the remaining tracks.

4. An apparatus for measuring displacement of a first object relative to a second object comprising:

a scale located on the first object having a plurality of tracks, each track having graduations with a graduation period;

a scanning unit located on the second object having means for scanning the plurality of tracks on the scale sequentially at different times, wherein a measured value for each track is sequentially read out beginning with a first track, the scanning unit having means to correct the measured values after measured values of the first track are corrected so that the corrected measured values represent values that would have been read out from each track after the first track if they had been readout at the same time the first track was read out.

5. An apparatus according to claim 4 wherein the graduation period of each track of the scale is different than the graduation period of any other track.

6. An apparatus according to claim 4 wherein the scanning unit includes a scanning plate having a plurality of scanning rows, each row scanning a particular track of the scale and each row having a plurality of scanning fields, wherein the graduation period of a first row of scanning fields is offset relative to the graduation period of the other scanning fields by one quarter of the graduation period of the track scanned by the row of scanning fields.

7. An apparatus according to claim 4 wherein the scanning unit comprises:

a light source for generating light, said light is directed to said scale;

a scanning plate to receive light from said scale and to produce light;

a detection unit to detect said light produced by said scanning plate; and said means to convert the measurement values including an evaluation unit connected to said detection unit said evaluation unit determining the corrected measured values for each track other than the first track.

8. An apparatus according to claim 7 wherein the evaluation unit includes memory for storing the measured values read out from the tracks.

* * * * *

UNITED STATES PATENT AND TRADEMARK OFFICE
CERTIFICATE OF CORRECTION

PATENT NO. : 5,456,021
DATED : October 10, 1995
INVENTOR(S) : Gunther Nelle et al.

It is certified that error appears in the above-indentified patent and that said Letters Patent is hereby corrected as shown below:

<u>On the Title Page</u>

In column 1, line 1 of the "Inventors" data, delete "Siebert" and substitute --Siegbert--.

Signed and Sealed this

Twentieth Day of February, 1996

Attest:

BRUCE LEHMAN

*Attesting Officer*  *Commissioner of Patents and Trademarks*